(12) United States Patent
Montmeat et al.

(10) Patent No.: US 11,710,653 B2
(45) Date of Patent: Jul. 25, 2023

(54) METHOD FOR MANUFACTURING A HANDLE SUBSTRATE INTENDED FOR TEMPORARY BONDING OF A SUBSTRATE

(71) Applicant: COMMISSARIAT À L'ENERGIE ATOMIQUE ET AUX ENERGIES ALTERNATIVES, Paris (FR)

(72) Inventors: Pierre Montmeat, Grenoble (FR); Frank Fournel, Grenoble (FR); Paul Stewart, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 14 days.

(21) Appl. No.: 17/459,785

(22) Filed: Aug. 27, 2021

(65) Prior Publication Data

US 2022/0068692 A1   Mar. 3, 2022

(30) Foreign Application Priority Data

Aug. 27, 2020   (FR) ..................... 20/08749

(51) Int. Cl.
*H01L 21/683*   (2006.01)
*H01L 23/00*   (2006.01)

(52) U.S. Cl.
CPC .......... *H01L 21/6835* (2013.01); *H01L 24/83* (2013.01); *H01L 24/98* (2013.01); *H01L 2224/83192* (2013.01); *H01L 2224/83948* (2013.01)

(58) Field of Classification Search
CPC ..... H01L 21/6835; H01L 24/83; H01L 24/98; H01L 2224/83192; H01L 2224/83948; H01L 2221/68318; H01L 2221/68327; H01L 2221/6834; H01L 2221/68381
USPC ........................................... 438/584
See application file for complete search history.

(56) References Cited

U.S. PATENT DOCUMENTS

| | | | |
|---|---|---|---|
| 8,236,670 B2 * | 8/2012 | Wessels ................. | B82Y 10/00 438/584 |
| 9,305,892 B2 * | 4/2016 | Yoko ...................... | C09J 201/02 |
| 2016/0189995 A1 * | 6/2016 | Gondcharton ...... | H01L 21/6835 438/107 |
| 2022/0059386 A1 * | 2/2022 | Fujikawa .......... | H01L 21/76256 |
| 2022/0320022 A1 * | 10/2022 | Kuo ...................... | H01L 21/565 |

* cited by examiner

*Primary Examiner* — Vu A Vu
(74) *Attorney, Agent, or Firm* — Oliff PLC

(57) ABSTRACT

Manufacturing a handle substrate includes: providing a support substrate having a receiving face; depositing an anti-adherent formulation including a first solvent over the receiving face of the support substrate so as to form a film; depositing a liquid formulation over a face of the film, before the complete evaporation of the first solvent, the liquid formulation being intended to form an adhesive layer; and evaporating the first solvent so as to obtain an anti-adherent film from the film in order to obtain the handle substrate and to obtain a bonding energy between the anti-adherent film and the adhesive layer lower than about 1.2 J/m². The step of depositing of a liquid formulation is carried out when the face of the film has a water drop angle smaller than 65 degrees, so as to avoid any risk of dewetting of the liquid formulation.

9 Claims, 2 Drawing Sheets

METHOD FOR MANUFACTURING A HANDLE SUBSTRATE INTENDED FOR TEMPORARY BONDING OF A SUBSTRATE

The present invention concerns a method for manufacturing a handle substrate intended for temporary bonding of a substrate in preparation of treatment steps for applications in the electronics, optics or optoelectronics fields. The invention also concerns a method for manufacturing a detachable substrate using this manufacturing method. According to another aspect, the invention concerns a handle substrate intended for temporary bonding of a substrate, as obtained by this manufacturing method, as well as a detachable substrate comprising said handle substrate obtained by this manufacturing method.

BACKGROUND

In general, temporary bonding techniques for wafers are set up so as to enable the completion of steps of treating the wafer while limiting, in particular, the risks of damage. These techniques use a handle substrate over which the wafer, for example made of a semiconductor material such as silicon, is temporarily bonded. In particular, they allow for an easy handling of the wafer so as to form electronic components on both faces thereof. According to a known solution, a first wafer which includes circuits on the front face is bonded by means of an adhesive on a temporary handle substrate. The temporary bonding is ensured, on the one hand, by spreading of the adhesive over the first wafer and, on the other hand, by the presence of an anti-adherent detachable layer over the support substrate constituting the handle substrate. This anti-adherent layer facilitates the detachment of the handle substrate on completion of the process by ensuring a low adherence between the adhesive and the handle substrate (<1000 mJ/m$^2$) and in particular a much lower adherence than that between the adhesive and the first wafer (>2000 mH/m$^2$). Once the handle substrate is removed, the adhesive is removed off the surface of the first wafer.

When the adhesive is a liquid formulation, spreading over the first wafer is generally carried out by spin coating which is followed by annealing intended to evacuate the solvents of the initial formulation.

In some particular cases, spreading the adhesive over the first wafer is not possible:
  The components that are present on the first wafer or the substrate cannot withstand the annealing operations required for shaping the adhesive.
  The surface of the first wafer is not wet enough to ensure a homogeneous deposit covering the adhesive.
  The first wafer is not compatible with the spreading equipment (thickness, material type, metallic contamination . . . ).
  The topography of the first wafer is not suited to the spreading process or to the next processes.

A particularly interesting solution consists in spreading the adhesive over the handle substrate in the presence of a detachable layer, before bonding on the first wafer. This possibility allows avoiding any spreading over the first wafer and the related drawbacks.

Nonetheless, the surface of the detachable layer generally has a very low surface energy, which confers thereon a low wetting nature with regards to the adhesive. Henceforth, if a liquid adhesive is deposited over this type of surfaces, unwetting of the adhesive is observed. This configuration makes bonding difficult, and even impossible.

SUMMARY

An object of the present invention is to overcome at least one of the aforementioned drawbacks. To this end, the present invention provides a method for manufacturing a handle substrate, the method comprising the steps of:
  a) providing a support substrate comprising a receiving face,
  b) depositing an anti-adherent formulation comprising a first solvent over the receiving face of the support substrate so as to form a film,
  c) depositing a liquid formulation over a face of the film, before the complete evaporation of the first solvent, the liquid formulation being intended to form an adhesive layer, and
  d) evaporating the first solvent so as to obtain anti-adherent film from the film in order to obtain the handle substrate and to obtain a bonding energy between the anti-adherent film and the adhesive layer lower than about 1.2 J/m$^2$ and preferably lower than about 0.4 J/m$^2$.

Thanks to this method of the present invention, it is possible to deposit the adhesive liquid formulation over the film without unwetting so as to achieve the desired anti-adherent properties of the film afterwards by evaporation of the first solvent. A handle substrate including an adhesive layer deposited over an anti-adherent film is then obtained. Thus, the method is advantageously devoid of any step of treating the anti-adherent film, such as a corona, UV, etc. treatment, conventionally performed in order to obtain a better hooking of the deposited adhesive layer.

DETAILED DESCRIPTION OF EMBODIMENTS

Figure 1:
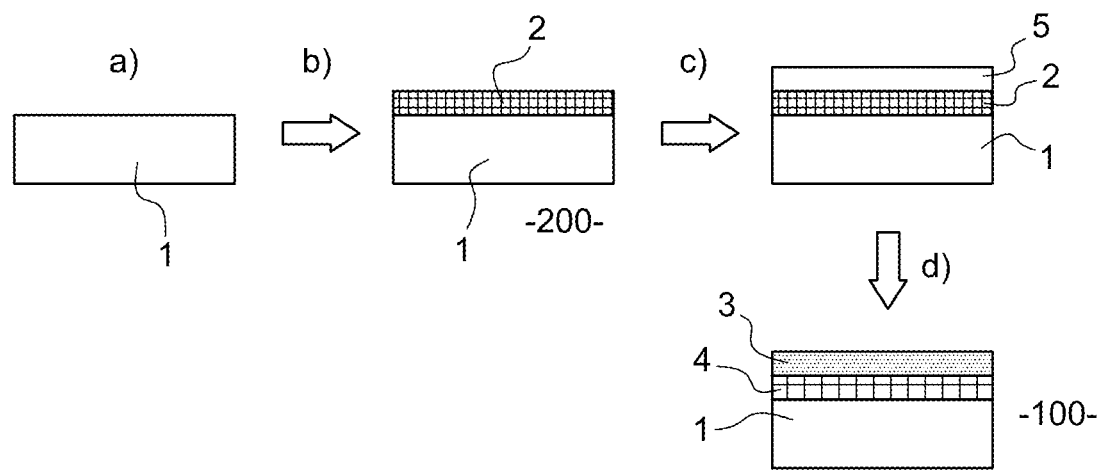
FIG. 1 illustrates steps a) to d) of a method for manufacturing a handle substrate according to an embodiment of the invention.

The present invention is based on results of experiments during which the inventors have observed that the anti-adherent nature of a film obtained by deposition of a liquid formulation varies and increases with the decrease of the content of solvent initially present in the film.

Indeed, an anti-adherent film comprising an anti-adherent material such as an organosilane polymer or a fluorinated polymer has a very low surface energy which is known for leading to unwetting of a deposit performed over the surface. As it will be seen hereinafter in the detailed description of the invention, such a film also has a water drop angle that is very large and larger than 90 degrees. The inventors of the present invention have compared the surface energy and the drop angle obtained for different deposits of hydrophobic formulations containing a hydrophobic material dissolved in a first solvent. In each experiment, the surface energy of the obtained anti-adherent film was low, the drop angle, in contrast, has turned out to be high and the spreading of the adhesive liquid formulation has led to unwetting.

When studying the kinetics of the evolution of the drop angle of a newly deposited hydrophobic film, the inventors have noticed that the drop angle was initially small and that it increased under ambient atmosphere. They have noticed that the film becomes highly hydrophobic and the surface energy becomes the lowest only once the first solvent has considerably, or totally, evaporated from the deposited film.

Based on this result, the inventors have carried out spreading of liquid formulations for adhesive layers over the surface of the film before complete evaporation of the first solvent. Under these conditions, no unwetting has been observed. The inventors have then left the first solvent evaporating in the presence of the adhesive layer until complete drying of the film. The latter has structured and has become highly hydrophobic without the adhesive layer being detached off its surface (cf. Examples 1 to 4).

When considering the parameter S governing the spreading of a liquid over a substrate, this parameter is related to the surface energy with $S=\gamma_s(\text{substrate})-\gamma_l(\text{liquid})$. When $S<0$, the deposited liquid unwets and when $S>0$, spreading of the liquid is possible. However, to have a proper spreading, it is preferable that S is higher than 5 mJ/m$^2$, and possibly 10 mJ/m$^2$.

Preferably, the film formed at step b) has a surface energy $\gamma_{finitial}$(initial film), the liquid formulation has a surface energy $\gamma_l$(liquid) and during the deposition of step b) $\gamma_{finitial}$ (initial film)>$\gamma_l$(liquid) so that the liquid formulation is deposited without unwetting. After evaporation of the first solvent according to step d), the surface energy of the anti-adherent film ys (substrat) is lower than $\gamma_{finitial}$(initial film) so as to have the bonding energy lower than about 1.2 J/m$^2$ and preferably lower than about <0.4 J/m$^2$.

According to a possibility of the present invention, the anti-adherent film has a surface energy $\gamma_s$(substrate) lower than 25 mJ/m$^2$ and preferably lower than 20 mJ/m$^2$.

Advantageously, the surface energy $\gamma_l$ (liquid) of the liquid formulation is comprised between 25 and 80 mJ/m$^2$.

Throughout the entire document, by 'handle substrate', it should be understood a support substrate (which may be a bulk substrate or a structure that could comprise several layers and/or substrates), suited for temporary bonding of a substrate of interest (wafer, whether functionalized or not), to handle it, and in particular for handling without the risk of damaging it during the application of treatments steps, as set out hereinbelow. The term 'handle substrate' of the invention may be translated by the expression handle wafer.

Also, throughout the entirety of the present document, the measurement of the surface energy is obtained by the Owens and Wendt method (D. Owens; R. Wendt, *J. Appl. Polym. Sci* 13 (1969), P. 1741-1747) carried out on KRUSS® DSA100, from 3 liquids: water, ethylene glycol and diiodomethane.

According to one arrangement, the anti-adherent formulation comprises an anti-adherent material diluted in the first solvent.

Advantageously, the anti-adherent material is a hydrophobic polymer, preferably a fluorinated polymer such as EGC 2702 with EGC 7200 as the first solvent, EGC 1700 with EGC 7100 as the first solvent, (available from 3M®) a perfluorodecyltrichlorosilane (FDTS supplied by Aesar GmbH & Co.) with isooctane as the first solvent, or an organosilane polymer, whether fluorinated or not, such as OctadecylTrichloroSilane (OTS) supplied by Sigma-Aldrich® with isooctane as the first solvent.

According to one possibility, the liquid formulation comprises an organophilic material, such as an organic polymer.

According to one implementation, the organophilic material is a liquid compound, such as the material LC 5200 supplied by the company 3M® or other polyacrylates.

According to one variant, the liquid formulation comprises an organophilic material and a second solvent, such as the material BrewerBOND®305, BsiT09001A supplied by the company Brewer Science or other adhesive polymers.

According to one arrangement, step b) is carried out by spreading the anti-adherent formulation by centrifugal coating, by a spreading by immersion or by spraying. Spreading by centrifugal coating is also called spin coating.

According to a particular embodiment, the receiving face of the support substrate is subjected to prior steps of cleaning the deposit of step b).

According to one possibility, the deposition of the anti-adherent formulation according to step b) is carried out only over the receiving face of the support substrate.

According to one possibility, step c) of depositing the liquid formulation is carried out by spin coating.

Advantageously, the method comprises, after step c) of depositing the liquid formulation, a step of evaporating the second solvent.

Advantageously, step d) leads to the evaporation of the second solvent. This also allows reducing the surface energy of the liquid and therefore accentuating the pursued low adherence.

According to one possibility, step d) comprises the application of a heat treatment.

According to one variant, step d) is carried out by placing the structure obtained at step c) under vacuum.

According to one possibility, the evaporation step d) is carried out until total evaporation of the first solvent and of the second solvent when the latter is present. Thus, the hydrophobic nature of the anti-adherent film and the detachable nature of the handle substrate that are obtained are optimum.

Advantageously, step c) is carried out before the total evaporation of the first solvent, so as said face of the film has a drop angle smaller than 65 degrees and preferably smaller than 60 degrees during the deposition of the liquid formulation at step c). The surface of the film having such drop angle values advantageously allows depositing the liquid formulation without unwetting. This means, in the present document, that when the water drop angle is smaller than 65 degrees, any unwetting is certainly avoided. Nonetheless, values of the water drop angle larger than 65 degrees do not mean that an unwetting will necessarily occur. When the water drop angle is larger than 65 degrees, there is risk, although limited, that a partial unwetting occurs, yet without preventing the completion of the invention.

In other words, step c) is carried out when said face of the film has a water drop angle smaller than 65 degrees and preferably smaller than 60 degrees during the deposition of the liquid formulation at step c), so as to avoid any risk of dewetting of the liquid formulation.

In the present document, by the expression 'drop angle', it should be understood a 'water drop angle' measured on the apparatus KRUSS® DSA100.

According to one arrangement, step b) and/or step c) are carried out at atmospheric pressure.

According to one possibility, step b) and/or step c) are carried out in an atmosphere composed of air, a neutral gas, for example nitrogen or helium, or a combination of neutral gases.

According to one embodiment, the method comprises, between step b) of forming the film and step c) of depositing the liquid formulation, the completion of a step i) of storing the structure comprising the film deposited over a receiving face of a support substrate in an enclosure saturated with the first solvent so as to keep the first solvent within the film. This arrangement allows keeping at least part of the initial amount of first solvent within the film for several hours. Thus, the drop angle of the film before completion of step c) is maintained at a very small value, compatible with a deposition of the liquid formulation without unwetting.

According to one arrangement, the storage according to step i) is carried out for several hours, for example 24 hours.

When the enclosure remains perfectly saturated with the first solvent over time, the storage according to step i) is carried out over a duration of several days or more.

For this purpose, the considered enclosure comprises a reactor provided with two sealed compartments contiguous to one another and configured so as to enable a fluidic communication therebetween. A first compartment is configured to receive a source of a first solvent intended to generate an atmosphere saturated with the first solvent. A second compartment is configured to receive said structure. The fluidic communication is operated between the two compartments so that the structure is stored in an atmosphere saturated with the first solvent over a duration allowing meeting the following condition: surface energy $\gamma_{f_{initial}}$(initial film)—surface energy $\gamma_l$(liquid)>0.

According to still another possibility, steps a) and/or b) are carried out in an enclosure saturated with the first solvent.

This arrangement avoids the displacement of the support substrate in an enclosure saturated with the first solvent for the completion of step i) to the extent that it is already therein.

When step b) is not carried out under an atmosphere saturated with the first solvent, it is not recommended to wait too long as it might lead to the total evaporation of the first solvent before completing step c).

Advantageously, step c) is carried out before the elapse of a predetermined duration $\Delta t$ as of the exposure of the film formed at step b) to ambient air (ambient atmosphere or N2, He). For example, this exposure to ambient air starts immediately upon completion of step b) or at the end of the storage step i).

The predetermined duration $\Delta t$ depends on the volatile nature of the first solvent.

According to one possibility, the predetermined duration $\Delta t$ is determined according to the value of the drop angle of the surface of the film obtained at step b).

According to one variant, the predetermined duration $\Delta t$ is determined so as to meet the following condition: surface energy $\gamma_{f_{initial}}$(initial film)—surface energy $\gamma_l$(liquid)>0.

According to one possibility, the support substrate is selected from silicon, silica, glass, sapphire, SiC, germanium, a III-V material such as AsGa, GaN or InP, a piezoelectric material such as LNO/LTO or a metal. For example, the metal of the support substrate is selected from molybdenum, tungsten, titanium, platinum and copper According to another aspect, the invention provides a method for manufacturing a detachable substrate, the method comprising the steps of:

k) providing the handle substrate obtained as previously described, l) providing a substrate comprising a front face and a rear face, the rear face being intended to receive electronic components, m) setting the front face of the substrate and an exposed face of the adhesive layer of the handle substrate in contact, so as to obtain a detachable substrate by temporary bonding of the substrate to the handle substrate.

Advantageously, the substrate comprises a material selected from silicon, silica, glass, SiC, sapphire, germanium, a III-V material such as AsGa, GaN or InP, a piezoelectric material such as LNO/LTO or a metal such as for example molybdenum, tungsten, platinum, titanium and copper. The substrate may also comprise a composite structure comprising one or several substrate(s) and/or one or several layer(s) of different semiconductor or metallic materials.

According to one arrangement, the substrate has already undergone prior preparation steps over the face before bonding or over the rear face, such as patterning.

Preferably, the front face of the substrate provided at step m) comprises electronic components.

Advantageously, in the case where the substrate is made of glass, the organophilic material is selected from a liquid material such as LC5200, for which a cross-linking is obtained by UV radiation throughout the glass substrate. This step allows completing the temporary bonding.

Preferably, the method comprises, after step m), a step n) of heat treatment for reinforcing the bonding between the substrate and the handle substrate.

On completion of step n), the adherence energy between the anti-adherent film and the adhesive layer of the detachable substrate is comprised between 150 and 1200 mJ/m$^2$.

Throughout the entirety of the present document, the values of the adherence energy (or bonding energy) are obtained by measurement by blade insertion according to Maszara WP et al., *J Appl Phys* 1988; 64:4943.

According to one possibility, the heat treatment for reinforcing the bonding between the substrate and the handle substrate of step n) participates in completing the evaporation of the first solvent. Thus, it is possible to carry out a partial evaporation of the first solvent at step d) and reduce the time required for the manufacture of the handle substrate.

According to one possibility, the method comprises, after step m) a step o) of applying to the rear face of the substrate at least one treatment step intended for the manufacture of electronic components, such as a rectification, a thinning, a chemical-mechanical polishing, an etching, a dielectric or metal deposition, a patterning, a passivation, a heat treatment, or a combination of at least one of these treatments.

Preferably, the method comprises a step p) of detachment at the interface between the anti-adherent film and the adhesive layer so as to detach the substrate.

Advantageously, the detachment step p) is carried out after step o) so as to detach the substrate treated by at least one treatment step according to step o).

According to one possibility, step p) consists in proceeding with a chemical attack and/or in applying a mechanical stress so as to separate the substrate from the handle substrate. The mechanical stress may consist in the application of a blade at the interface between the handle substrate and the substrate, with a tensile force or a shear force. For example, it may be applied while imposing a curvature on the structure constituted by the substrate and the handle substrate, for example by stamping on an adapted preform.

According to one possibility, after the detachment step p), the substrate is cleaned for example by a step of rinsing with limonene and then with isopropanol in order to eliminate the residual adhesive layer.

According to another aspect, the invention provides a handle substrate intended for temporary bonding of a substrate, the handle substrate comprising a support substrate, an anti-adherent film formed over a receiving face of the support substrate and an adhesive layer deposited over one face of the anti-adherent film, the anti-adherent film allowing obtaining a bonding energy between the anti-adherent film and the adhesive layer that is lower than about 1.2 J/m$^2$ and preferably lower than about 0.4 J/m$^2$.

Advantageously, the surface energy $\gamma_s$(substrate) of the anti-adherent film is lower than the surface energy of the liquid adhesive formulation $\gamma_l$(liquid), and preferably $\gamma_l$(liquid)–$\gamma_s$(substrate)>5 J/m$^2$ and still preferably $\gamma_l$(liquid)–$\gamma_s$(substrate)≥10 J/m$^2$.

By the expression surface energy $\gamma_s$(substrate) of the anti-adherent film, it should be understood, in the present document, the surface energy of the anti-adherent film whose solvent present in the precursor anti-adherent formulation has evaporated.

By the expression 'the adhesive layer deposited over a face of the anti-adherent film', it should be understood, in the present document, a stack comprising an adhesive layer disposed in contact with the anti-adherent film. The stack is devoid of any other complementary layer, film or glue. The adhesive layer and the anti-adherent film of the stack are secured together. The stack has an adherence energy comprised between 150 and 1200 mJ/m$^2$.

Advantageously, the support substrate of the handle substrate is selected from silicon, silica, glass, sapphire, SiC, germanium, a III-V material such as AsGa, GaN or InP, a piezoelectric material such as LNO/LTO or a metal such as molybdenum, tungsten, titanium, platinum and copper. The anti-adherent film of the handle substrate comprises an anti-adherent material such as a hydrophobic polymer, preferably a fluorinated polymer such as EGC 2702, EGC 1700, a FDTS or an organosilane polymer such as OTS. The adhesive layer of the handle substrate comprises an organic material, such as an organic polymer, preferably Brewer-BOND®305, BsiT09001A or the polymer obtained from LC5200.

According to a particular embodiment, the anti-adherent film has a thickness smaller than 50 nanometers and preferably comprised between 1 and 15 nm, and the adhesive layer has a thickness comprised between 10 and 100 micrometers and preferably between 20 and 60 micrometers.

According to one arrangement, the anti-adherent film covers the entirety of the receiving face of the support substrate.

According to one possibility, the adhesive layer covers the entirety of the face of the film over which the liquid formulation has been deposited.

According to still another arrangement, the invention provides a detachable substrate comprising a substrate bonded to a handle substrate as previously described, through the adhesive layer deposited over a face of the anti-adherent film, the adherence energy of the detachable substrate being comprised between 150 mJ/m$^2$ and 1200 mJ/m$^2$.

Other aspects, objects and advantages of the present invention will appear better upon reading the following description of an embodiment thereof, provided as non-limiting examples and made with reference to the appended drawings. In the following description, for simplicity, identical, similar or equivalent elements of the different embodiments bear the same reference numerals. To improve readability, the figures are not necessarily to the scale of all of the represented elements, wherein:

FIG. 1 represents a method for manufacturing a handle substrate 100 according to an embodiment of the present invention. As illustrated, a support substrate 1 is provided according to step a) of the method. The deposition of an anti-adherent formulation over a receiving face of the support substrate 1 is carried out according to step b) of the method. This deposition leads to the formation of a film 2 composed by an anti-adherent material and by a first solvent. According to a possibility that is not shown in FIG. 1, the deposition is carried out by spreading the anti-adherent formulation by spin coating. According to a non-illustrated variant, the deposition is carried out by spreading by immersion or by spraying.

According to step c) of the method, a liquid formulation intended to form an adhesive layer 3 is deposited over an exposed face of the film 2 so as to form a layer 5. This step c) is performed before the elapse of a predetermined duration Δt to be counted as of the exposure of said film 2 to ambient air to avoid the complete evaporation of the first solvent. Indeed, the formation of this layer 5 without unwetting is made possible by the fact that the film 2 contains enough first solvent for its drop angle to remain smaller than 65 degrees and preferably smaller than 60 degrees at the time of deposition of the liquid formulation according to step c). The liquid formulation comprises an organic material and a second solvent. It has a surface energy $\gamma_l$ (liquid).

According to a possibility that is not shown in FIG. 1, the deposition of the layer 5 is carried out by spreading the liquid formulation by spin coating.

Afterwards, a step d) of evaporating the first solvent is performed to lead to the formation of the anti-adherent film 4 from the film 2 obtained at step b). If it is structured alone (without the deposition of the adhesive layer before the end of the evaporation of the solvent), the anti-adherent film 4 would have a ('natural') surface energy $\gamma_s$(substrate) that is lower than the surface energy of the liquid adhesive formulation $\gamma_l$(liquid), and preferably $\gamma_l$(liquid)–$\gamma_s$(substrate)>5 J/m$^2$ and still preferably $\gamma_l$(liquid)–$\gamma_s$(substrate)≥10 J/m$^2$.

The second solvent is evaporated concomitantly and an adhesive layer 3 is obtained from the liquid formulation deposited at step c).

According to one possibility, step d) is carried out by application of a heat treatment on the structure obtained at step c). The heat treatment accelerates the kinetics of evaporation of the first solvent and of the second solvent, where appropriate.

According to other variants, step d) is carried out by leaving the structure obtained at step c) at ambient temperature under an ambient atmosphere or by placing the structure obtained at step c) in vacuum.

The handle substrate 100 obtained in this manner includes a support substrate 1, an anti-adherent film 4 formed over the receiving face of the support substrate 1, an adhesive layer 3 deposited over the anti-adherent film 4. Should it be structured alone, the anti-adherent film would have a lower surface energy $\gamma_s$(substrate) than the surface energy of the liquid adhesive formulation $\gamma_l$(liquid), preferably $\gamma_l$(liquid)–$\gamma_s$(substrate)>5 J/m$^2$ and still preferably $\gamma_l$(liquid)–$\gamma_s$(substrate) 10 J/m$^2$.

It should be noted that the surface energy $\gamma_{fjnitial}$(initial film) of the film 2 at step c) is higher than the surface energy $\gamma_l$(liquid) enabling the deposition without unwetting.

The support substrate 1 is selected from silicon, silica, glass, sapphire, SiC, germanium, a III-V material such as AsGa, GaN or InP, a piezoelectric material such as LNO/LTO or a metal (for example molybdenum, tungsten, titanium, platinum and copper). The anti-adherent film 4 comprises an anti-adherent material such as a hydrophobic polymer, for example a fluorinated polymer such as EGC 2702, EGC 1700, a FDTS or an organosilane polymer such as OTS. It has a thickness smaller than 50 nm and preferably comprised between 1 and 15 nm. A thicker anti-adherent film 4 considerably reduces the evaporation capacity of the first solvent and thus the anti-adherent nature of the film 4 obtained at step d). The drop angle measurements of such anti-adherent films 4 obtained on completion of a complete drying are larger than 80 degrees and preferably larger than 100 degrees.

The adhesive layer 3 of the handle substrate 100 comprises an organic material, such as an organic polymer, preferably BrewerBOND®305, BsiT09001A supplied by Brewer Science. Its thickness is comprised between 20 and 50 micrometers. The drop angles of such an adhesive layer 3 are comprised between 50 and 60 degrees.

These pairs of anti-adherent films 4 and adhesive layers 3 allow limiting the adherence energy of the detachable substrate 400 targeted by the present invention as it will be shown hereinafter.

Figure 2:
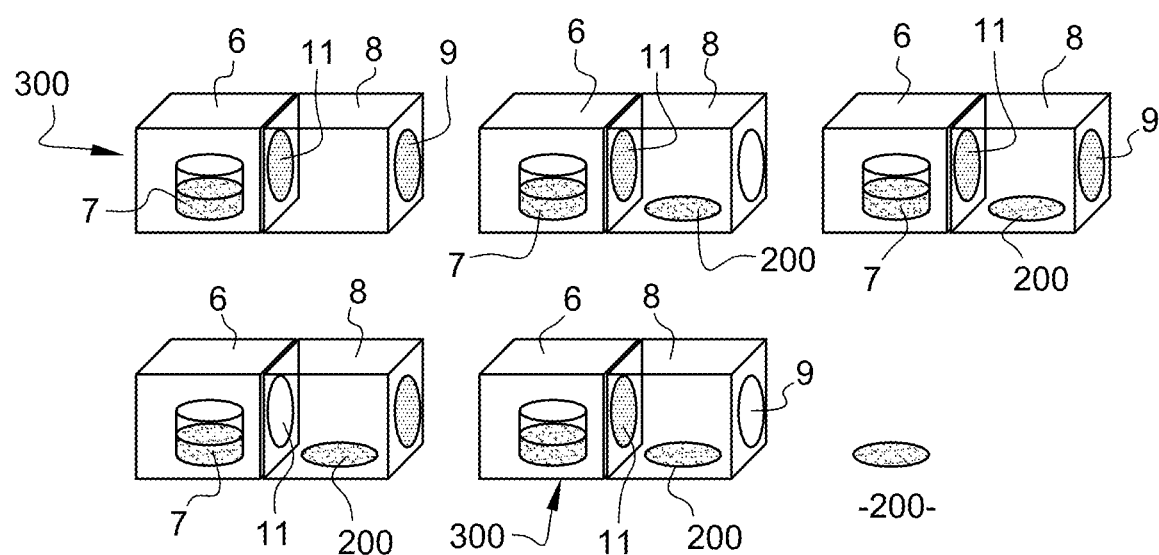
FIG. 2 illustrates the step i) of storing a structure obtained at step b) of the method for manufacturing a handle substrate.

According to a variant of the method for manufacturing the handle substrate 100, illustrated in FIG. 2, step c) is preceded by a step i) of storing the structure 200 obtained at step b) comprising the film 2 formed over a receiving face of the support substrate 1, in an enclosure 300 saturated with the first solvent so as to limit the evaporation of the first solvent contained in the film 2. Thus, the drop angle of the film barely varies during the storage and the structure 200 could be used to perform step c) even after several hours and even 24 hours or more.

For this purpose, the inventors have considered an enclosure 300 comprising a reactor provided with two sealed compartments, contiguous to one another and configured so as to enable a fluidic communication therebetween, as illustrated in FIG. 2. A first compartment 6 is configured to receive a source 7 of a first solvent intended to generate an atmosphere saturated with the first solvent. The second compartment 8 is configured to receive said structure 200. The sequence of steps of handling the enclosure 300 for storage is illustrated by the contiguous diagrams of FIG. 2, according to a chronological order. The second compartment 8 comprises an outer wall throughout which a sealed door 9 is formed and configured for the introduction of said newly spread structure (and for removal thereof). A sealed openclose device 11 disposed between the two compartments is open to enable the circulation of the solvent in both compartment. Configured this way, the sealed reactor has an optimum effectiveness to avoid the evaporation of the first solvent contained in the film 2 before carrying step c).

These precautions taken in the storage in an enclosure 300 saturated with the first solvent and the fact that step c) is carried out before the elapse of a predetermined duration Δt to be counted as of the exposure of the film 2 to ambient air, outside the enclosure 300, (or under a N2, He atmosphere), allow keeping the surface energy $\gamma_{f_{initial}}$(initial film) higher than that of the liquid formulation $\gamma_l$(liquid) and thus depositing the liquid formulation of an organophilic material to form the layer 5 over an anti-adherent film.

Indeed, depending on the kinetics of the evolution of the drop angle of the film 2 after step b), the drop angle increases with the duration of contact with air (or N2, He) and the evaporation of the first solvent present in the film 2. Thus, the predetermined duration Δt is determined according to the value of the drop angle which directly depends on the surface energy of the film. Also, the predetermined duration Δt is shorter than or equal to 30 min for an example of a material consisting of EGC 2702 diluted in a first solvent EGC 2700 so as to maintain a drop angle smaller than 65° during the completion of step c).

According to a variant that is not shown in FIG. 2, the support 1 is directly provided in the enclosure 300 saturated with the first solvent (step a), and then step b) of depositing the anti-adherent formulation for the formation of the film 2 is also carried out in the enclosure 300 saturated with the first solvent. A storage step i) may prolong the stay of the structure 200 in the enclosure 300 before carrying step c).

Figure 3:
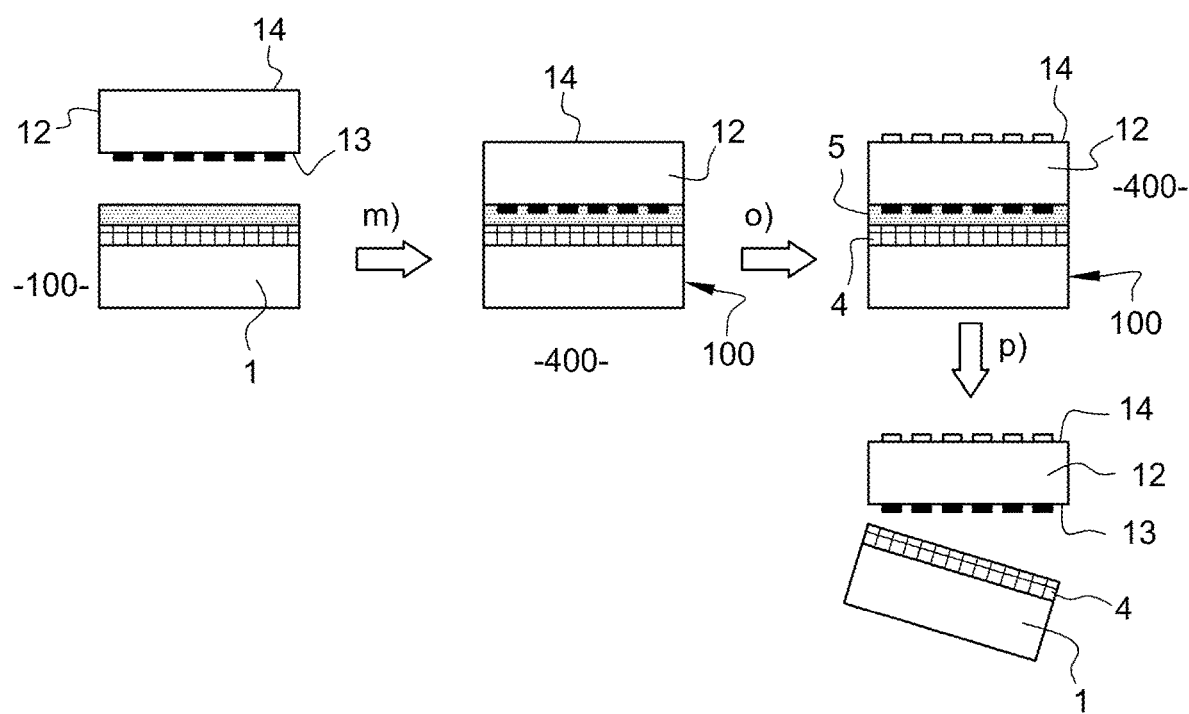
FIG. 3 illustrates steps k) to p) of a method for manufacturing a detachable substrate according to an embodiment of the invention.

According to another aspect illustrated in FIG. 3, the invention provides the manufacture of a detachable substrate 400. For this purpose, a substrate 12 having a front face 13 and a rear face 14 and a handle substrate 100 as previously described are provided according to steps k) and l) of the method. An exposed face of the adhesive layer 3 of the handle substrate 100 is set in contact with the front face 13 of the substrate 12 for a temporary bonding according to step m) of the method enabling the obtainment of the detachable substrate 400. Then, a heat treatment for reinforcing the bonding is applied according to a step n) (not shown in the figures). Typically, the adherence energy of the detachable substrate 400 obtained in this manner is comprised between 150 and 1200 mJ/m².

The material of the substrate 12 is selected from silicon, glass, sapphire, germanium, SiC, a III-V material such as AsGa, GaN, InP, a piezoelectric material such as LNO/LTO or a metal such as molybdenum, tungsten, titanium, platinum and copper, depending on the nature of the desired subsequent operations.

According to an arrangement that is not shown in the figures, when the liquid formulation is LC 5200 supplied by 3M®, the substrate 12 is advantageously made of glass to enable the insulation of the compound LC5200 throughout the glass and complete the temporary bonding with the substrate 12.

The obtained detachable substrate 400 is then subjected to the application of a treatment step o) intended for the manufacture of electronic components and applied on the exposed rear face 14 of the substrate 12 (that is to say the surface devoid of any bonding or complementary layer as the front face 13 is bonded to the handle substrate 100). For example, this treatment step comprises a rectification, a thinning, a chemical-mechanical polishing, an etching, a dielectric or metal deposition, a patterning, a passivation, a heat treatment, or a combination of at least one of these treatments.

Afterwards, a detachment step p) is carried out on the detachable substrate 400 prepared in this manner so as to detach the substrate 12 at least partially treated or functionalized. This detachment step p) is conventionally done through a series of chemical and/or mechanical actions.

Some control examples and examples of carrying out the method for manufacturing a handle substrate 100 and a detachable substrate 400 according to the present invention are given hereinbelow.

The following examples have been performed by means of 200 mm diameter silicon wafers.

Example 1: Anti-Adherent Film 4 Comprising the Fluorinated Polymer EGC 2702

The fluorinated polymer EGC 2702 is commercialized as a solution in the solvent EGC 7200.

Controls: Over a silicon wafer, 40 μm of BrewerBOND®305, available from the company Brewer Science, are spread by spin coating. Afterwards, the substrate is annealed at 200° C. and then bonded at 200° C. to a second silicon wafer. The adherence of this structure is estimated to 2000 mJ/m².

Over a silicon wafer, a film of EGC 2702 is spread and then annealed at 150° C. The surface features a water drop angle of 105°. Spreading by spin coating of 40 μm of the adhesive BrewerBOND®305 at the surface of this treated substrate leads to an unwetting of the adhesive.

Example of implementation of the invention: Over a support substrate 1 made of silicon, a film of EGC 2702 in the first solvent 7200 is spread according to step b) of the method. After the elapse of a predetermined duration Δt of 20 min after spreading, this structure 200 is stored according to step i) in an enclosure 300 saturated with EGC 7200. After one day, the structure 200 is extracted from the enclosure 300 and a liquid formulation of BrewerBOND®305 is immediately spread by spin coating according to step c) in order to form an adhesive layer 3 of 40 μm over the surface of the film 2. The adhesive layer 3 is homogeneous and no unwetting is observed. The set is annealed by a heat treatment at 200° C. for 5 minutes according to step d) of the method so as to obtain the handle substrate 100.

Setting this handle substrate 100 in contact at 200° C. with a rear face 14 of a silicon substrate according to step m) leads to the obtainment of a detachable substrate 400 having a low adherence energy of 400 mJ/m$^2$ which confirms the organophobic and anti-adherent nature of the fluorinated film 4 structured this way.

Example 2: Anti-Adherent Film 4 Comprising Perfluorodecyltrichlorosilane (FDTS)

The fluorinated polymer FDTS is solubilized in isooctane.

Control: Over a silicon wafer, a liquid formulation of the adhesive BsiT09001A is spread by spin coating over a 50 μm thickness. Afterwards, this substrate is annealed at 200° C. for 5 minutes and then bonded at 200° C. to a second silicon wafer. The adherence energy of this structure is estimated to 2000 mJ/m$^2$.

Example of implementation of the invention: Over a support substrate 1 made of silicon, a formulation comprising FDTS dissolved in isooctane at $5.10^{-3}$ mol/L is spread according to step b) of the method. Spreading by immersion consists in soaking the support substrate 1 in a solution of FDTS in isooctane for 5 minutes. The formed film has a thickness of 10 nm and the water drop angle is 40°. After the elapse of a predetermined duration Δt of 20 min after spreading, this wafer is placed in an enclosure 300 saturated with isooctane according to step i). After 24 h, the wafer is extracted from the enclosure 300, the water drop angle is 50 degrees (versus 120 degrees for the anti-adherent film 4 whose first solvent has totally evaporated). A liquid formulation of the adhesive BsiT09001A is spread by spin coating to form an adhesive layer 3 of 50 μm over the face of the film according to step c). The layer of the adhesive is homogeneous and no unwetting is observed. A heat treatment is performed at 200° C. for 5 minutes according to step d) of the method in order to obtain the handle substrate 100. Setting this handle substrate 100 in contact with a face of a silicon substrate according to step m) followed by a heat treatment applied at 200° C. according to step n) lead to the obtainment of a detachable substrate 400 having a low adherence energy of 900 mJ/m$^2$ which confirms the anti-adherent nature of the fluorinated film structured this way.

Example 3: Anti-Adherent Film 4 Comprising EGC 1700

The fluorinated polymer EGC 1700 is commercialized as a solution in the first solvent EGC 7100.

Control: Over a silicon wafer, 40 μm of the liquid formulation BrewerBOND®305 are spread by spin coating. Afterwards, the substrate is annealed at 200° C. and then bonded at 200° C. to a second silicon wafer. The adherence energy of this structure is estimated to 2000 mJ/m$^2$.

Over a silicon wafer, a film of EGC 1700 is spread and then annealed at 120° C. The surface features a water drop angle of 105°. Spreading by spin coating of 40 μm of the adhesive BrewerBOND®305 at the surface of this treated substrate leads to an unwetting of the adhesive.

Example of implementation of the invention: Over a substrate made of silicon, a formulation of EGC 1700 in the first solvent 7100 is spread according to step b). After the elapse of a duration of 10 min, 40 μm of a liquid formulation of the adhesive BrewerBOND®305 is spread by spin coating over the face of the film according to step c). The adhesive layer 3 is homogeneous and no unwetting is observed. The set is annealed at 200° C. for 5 minutes according to step d). The hot bonding (200° C.) of this handle substrate 100 to a silicon substrate leads to the obtainment of a detachable substrate 400 having a low adherence energy of 200 mJ/m$^2$ which confirms the organophobic and anti-adherent nature of the fluorinated film structured this way.

Example 4: Anti-Adherent Film 4 Comprising the Compound OTS: $CH_3(CH_2)_{17}SiCl_3$ The compound OTS ($CH_3(CH_2)_{17}SiCl_3$) is solubilized in isooctane at a concentration of $5.10^{-3}$ mol/L.

Controls: Over a silicon wafer, 20 μm of the liquid formulation BrewerBOND®305 are spread by spin coating. Afterwards, the substrate is annealed at 200° C. and then bonded at 200° C. to a second silicon wafer. The adherence energy of this structure is estimated to 2000 mJ/m$^2$.

Over a silicon wafer, a film of OTS is spread. Thus, a few mono-layers of OTS are grafted onto the silicon surface. The surface of the film features a water drop angle of 110°. Spreading by spin coating of 20 μm of the adhesive BrewerBOND®305 at the surface of this treated substrate leads to an unwetting of the adhesive.

Example of implementation of the invention: Over a support substrate 1 made of silicon, a film of OTS is spread according to step b). After the elapse of a predetermined duration of 20 min after spreading, this wafer is stored according to step i) in an enclosure 300 saturated with isooctane. After one day, the wafer is extracted from the enclosure 300 and a liquid formulation of the adhesive BrewerBOND®305 is spread by spin coating over its face so as to form an adhesive layer 3 having a thickness of 20 μm. The adhesive layer 3 is homogeneous and no unwetting is observed. The set is annealed at 200° C. according to step d). The hot bonding (200° C.) of this handle substrate 100 to a silicon substrate leads to the obtainment of a detachable substrate 400 having a low adherence energy of 80 mJ/m$^2$ which confirms the anti-adherent nature of the film structured this way.

Thus, the present invention provides a method that is ingenious, easy to implement and inexpensive for the manufacture of a handle substrate 100 intended for temporary bonding of a substrate 12 to be treated.

It goes without saying that the invention is not limited to the embodiments described hereinabove as examples but it encompasses all technical equivalents and variants of the described means as well as combinations thereof.

The invention claimed is:

1. A method for manufacturing a handle substrate, the method comprising the steps of:
   a) providing a support substrate comprising a receiving face,
   b) depositing an anti-adherent formulation comprising a first solvent over the receiving face of the support substrate so as to form a film,
   c) depositing a liquid formulation over a face of the film, before the complete evaporation of the first solvent, the liquid formulation being intended to form an adhesive layer, and
   d) evaporating the first solvent so as to obtain an anti-adherent film from the film in order to obtain the handle substrate and to obtain a bonding energy between the anti-adherent film and the adhesive layer lower than about 1.2 J/m$^2$,
   wherein step c) is carried out when said face of the film has a water drop angle smaller than 65 degrees during the deposition of the liquid formulation at step c), so as to avoid any risk of dewetting of the liquid formulation.

2. The method for manufacturing a handle substrate according to claim 1, comprising, between step b) of forming the film and step c) of depositing the liquid formulation, the completion of a step i) of storing a structure comprising the film deposited over a receiving face of a support substrate in an enclosure saturated with the first solvent so as to keep the first solvent within the film.

3. The method for manufacturing a handle substrate according to claim 1, wherein steps a) and/or b) are carried out in an enclosure saturated with the first solvent.

4. The method for manufacturing a handle substrate according to claim 1, wherein step d) is carried out by application of a heat treatment.

5. The method for manufacturing a handle substrate according to claim 1, wherein the support substrate is selected from silicon, silica, glass, sapphire, SiC, germanium, a III-V material, a piezoelectric material or a metal, the anti-adherent film comprises an anti-adherent material and the adhesive layer comprises an organophilic material.

6. A method for manufacturing a detachable substrate, the method comprising the steps of:
   k) providing the handle substrate obtained according to claim 1,
   l) providing a substrate comprising a front face and a rear face, the rear face being intended to receive electronic components,
   m) setting the front face of the substrate and an exposed face of the adhesive layer of the handle substrate in contact, so as to obtain a detachable substrate by temporary bonding of the substrate to the handle substrate.

7. The method for manufacturing a detachable substrate according to claim 6, wherein the method comprises, after step m), a step n) of heat treatment for reinforcing the bonding between the substrate and the handle substrate.

8. The method for manufacturing a detachable substrate according to claim 6, wherein the method comprises, after step m), a step o) of applying to the rear face of the substrate at least one treatment step intended for the manufacture of electronic components, such as a rectification, a thinning, a chemical-mechanical polishing, an etching, a dielectric or metal deposition, a patterning, a passivation, a heat treatment, or a combination of at least one of these treatments.

9. The method for manufacturing a detachable substrate according to claim 7, comprising a step p) of detachment at the interface between the anti-adherent film and the adhesive layer so as to detach the substrate.

* * * * *